United States Patent
Lee

(10) Patent No.: US 7,112,473 B2
(45) Date of Patent: Sep. 26, 2006

(54) DOUBLE SIDE STACK PACKAGING METHOD

(75) Inventor: Naewon Lee, Seoul (KR)

(73) Assignee: Dongbuanam Semiconductor Inc., Seoul (KR)

( * ) Notice: Subject to any disclaimer, the term of this patent is extended or adjusted under 35 U.S.C. 154(b) by 0 days.

(21) Appl. No.: 10/747,195

(22) Filed: Dec. 30, 2003

(65) Prior Publication Data

US 2004/0152235 A1    Aug. 5, 2004

(30) Foreign Application Priority Data

Dec. 30, 2002    (KR)    ............ 10-2002-0086407

(51) Int. Cl.
*H01L 21/44* (2006.01)
*H01L 21/48* (2006.01)
*H01L 51/50* (2006.01)

(52) U.S. Cl. .................... 438/122; 438/112
(58) Field of Classification Search ........... 438/109, 438/25–27, 51, 55, 107–108, 112, 118, 127, 438/617, 110, 122; 257/777, 686, 689, 723, 257/778; 29/854–855, 874–883
See application file for complete search history.

(56) References Cited

U.S. PATENT DOCUMENTS

| | | | |
|---|---|---|---|
| 6,093,969 A * | 7/2000 | Lin ............................ | 257/777 |
| 6,265,782 B1 * | 7/2001 | Yamamoto et al. ......... | 257/783 |
| 6,300,163 B1 * | 10/2001 | Akram ....................... | 438/108 |
| 6,559,525 B1 * | 5/2003 | Huang ........................ | 257/675 |
| 6,815,251 B1 * | 11/2004 | Akram et al. ............... | 438/107 |
| 2003/0030151 A1 * | 2/2003 | Morozumi .................. | 257/777 |
| 2003/0064547 A1 * | 4/2003 | Akram et al. ............... | 438/108 |

* cited by examiner

*Primary Examiner*—Thanhha Pham
(74) *Attorney, Agent, or Firm*—Pillsbury Winthrop Shaw Pittman, LLP

(57) ABSTRACT

In a double side stack packaging a plurality of chips, a hole is formed in a substrate. A first chip is attached to a bottom surface of the substrate by using a thermo compression and is electrically interconnected to terminals formed at sidewall of the hole using a wire bonding. Next, an epoxy is coated on the substrate and the first chip and a first heat spreader is installed thereon and then the epoxy is cured. Thereafter, a second chip is attached to a top surface of the substrate by using the epoxy and is electrically interconnected to terminals formed on the substrate using the wire bonding. And then, an encapsulation resin is coated on the substrate and the first chip and a second heat spreader is installed thereon and then the epoxy is cured.

10 Claims, 2 Drawing Sheets

DOUBLE SIDE STACK PACKAGING METHOD

FIELD OF THE INVENTION

The present invention relates to a method of a double side stack package; and, more particularly, to a method for double side stack packaging a plurality of chips at both a top and a bottom surface of a substrate using a hole formed therein to reduce the thickness of the double side stack package and to enhance a packaging efficiency.

BACKGROUND OF THE INVENTION

FIG. 1 illustrates a cross sectional view of a conventional multi-stack chip size package (CSP).

Referring to FIG. 1, a first chip (or die) 21 is adhered on a substrate 11, e.g., a printed circuit board, with an epoxy and a second die 31 is stacked on the first chip 21 with the epoxy. Bonding pads on the first and the second chip 21 and 31 are electrically connected with terminals on the printed circuit board 11 by conductive wires 51. A resin, e.g., an epoxy molding compound (EMC) 41 is used to mold the first and the second chip 21 and 31, and the electrical connection between the whole package and another printed circuit board can be achieved by a ball grid array using solder balls 61.

The drawback of this conventional multi-stack chip size packaged device is that a thickness thereof is to be enlarged, e.g., about 1.4 mm, because of the molding material of the multi-stack CSP, i.e., the resin, to thereby require a long conductive wires 51, i.e., a long signal transmission path. Therefore, the characteristics of the multi-stack chip size packaged device are deteriorated and the applicability thereof is also reduced. In addition, heat dissipation thereof is not effective.

SUMMARY OF THE INVENTION

It is, therefore, an object of the present invention to provide a method for double side stack packaging a plurality of chips at both a top and a bottom surface of a substrate using a sidewall of a hole formed therein to reduce the thickness of the double size stack package and to enhance a packaging efficiency.

In accordance with the present invention, there is provided a method for double side stack packaging a plurality of chips, which including the steps of: forming a hole through a substrate; attaching a first chip to a bottom surface of the substrate to cover a bottom of the hole by using a thermo compression; electrically interconnecting the first chip to terminals formed on an inner sidewall of the hole using a wire bonding; coating an epoxy on the substrate and the first chip and installing thereon a first heat spreader and then curing the epoxy; attaching a second chip to a top surface of the substrate by using an epoxy; electrically interconnecting the second chip to terminals formed on the substrate using the wire bonding; and coating an encapsulation resin on the substrate and the first chip and installing thereon a second heat spreader and then curing the epoxy.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

A preferred embodiment in accordance with the present invention will now be described with reference to the accompanying drawings.

Figure 1:
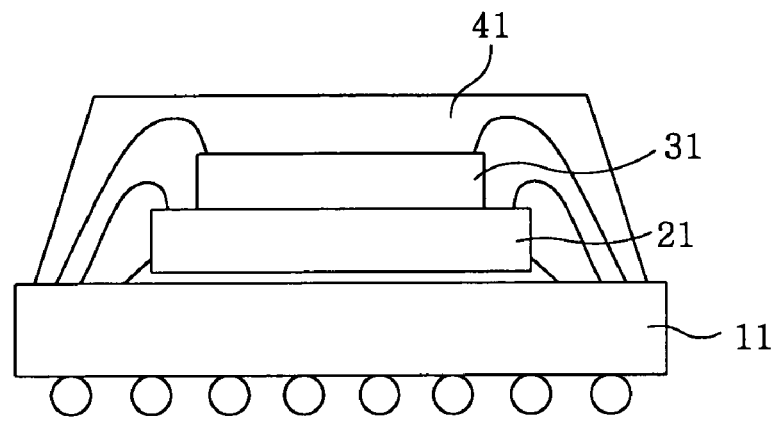
FIG. 1 represents a cross sectional view of a conventional multi-stack chip size package (CSP)
Figure 2:
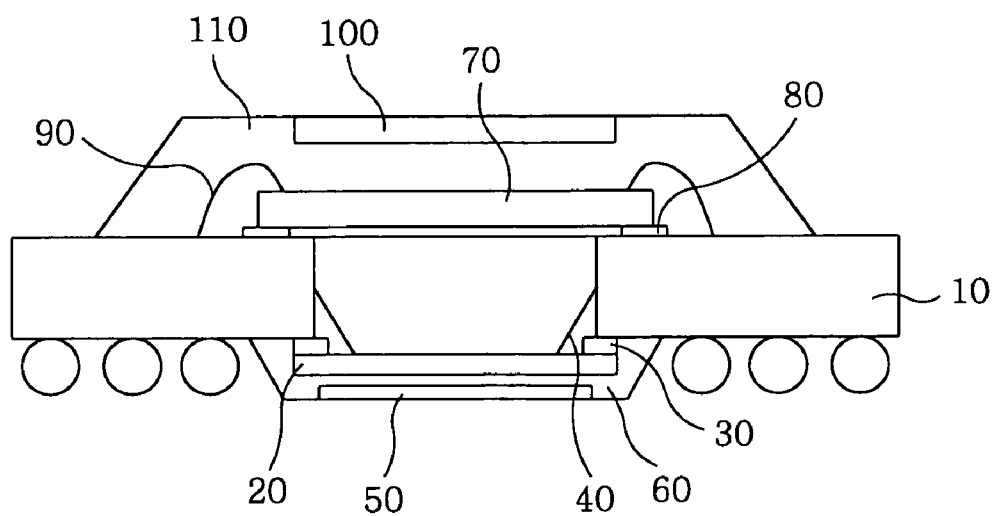
FIG. 2 illustrates a cross sectional view of a double side stack package in accordance with a preferred embodiment of the present invention.

FIG. 2 illustrates a cross sectional view showing a double sides stack package in accordance with a preferred embodiment of the present invention.

Figure 3:
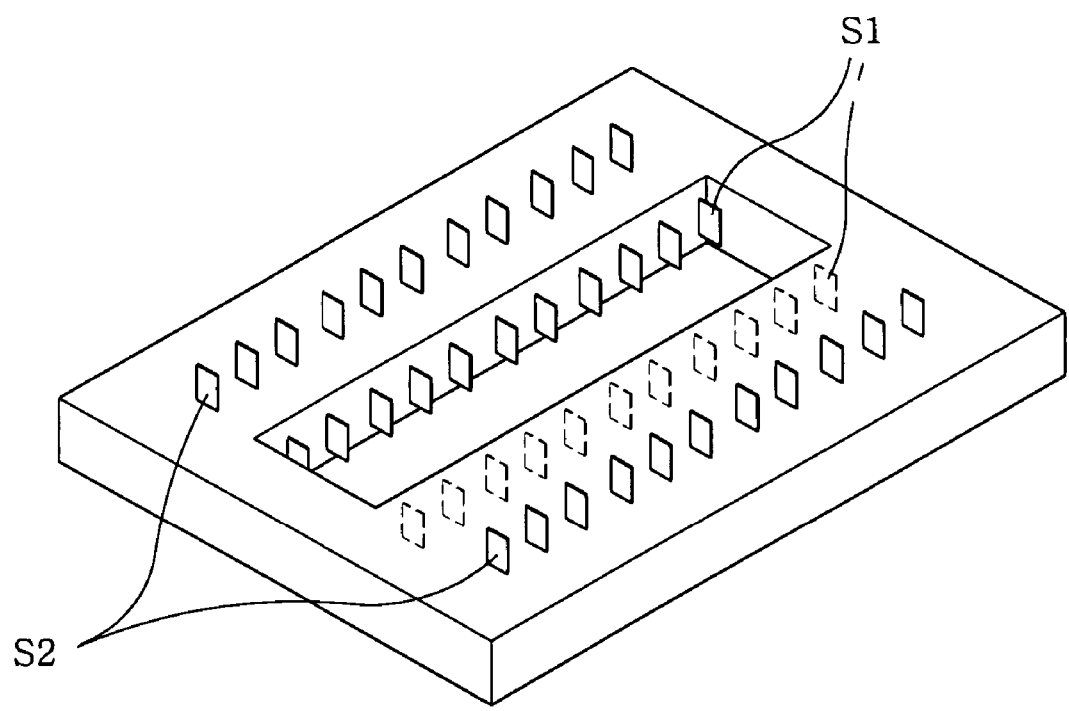
FIG. 3 depicts a perspective view of a substrate having a hole embedded therein to produce a double side stack package in accordance with the preferred embodiment of the present invention.

FIG. 3 depicts a perspective view of a substrate having a hole embedded therein to produce a double side stack package in accordance with the preferred embodiment of the present invention.

Referring to FIGS. 2 and 3, a hole is formed through a substrate 10, e.g., a printed circuit board (PCB). A first chip 20, e.g., a flip chip, is attached onto a bottom surface of the substrate 10 to cover a bottom of the hole by way of a thermo compression or a tape automatic bonding (TAB) 30. The first chip 20 must cover at least a portion of the bottom of the hole. Next, bonding pads on the chip 20 are electrically connected with terminals S1 formed at an inner sidewall of the hole by conductive wires 40 as shown in FIG. 3.

Thereafter, the first chip 20 with a heat spreader 50 embedded thereon and the bottom surface of the substrate 10 are encapsulated by an insulating material, e.g., an epoxy 60. And then, the insulating material is cured. The heat spreader 50 facilitates a dissipation of heat to be generated in the first chip 20.

Next, the epoxy 80 is coated to a top surface of the substrate 10 and a second chip 70 is attached to the top surface of the substrate to cover a top of the hole. Next, bonding pads on the second chip 70 are electrically connected with terminals S2 on the substrate 10 by conductive wires 90 as shown in FIG. 3.

Next, a resin, e.g., an epoxy molding compound (EMC) 110 is coated on the substrate 10 and the second chip 70 and a heat spreader 100 is installed on the resin and then the resin is cured.

Therefore, the double side stack packaged device in accordance with the preferred embodiment of the present invention uses the top and the bottom surface of the substrate 10 and the sidewall of the hole formed therein to thereby enhance a packaging efficiency. Also, by reducing the thickness of the device, e.g., less than 1.0 mm, that is to say, an electrical distance between the chips and the PCB, operational characteristics of the device can be enhanced.

While the invention has been shown and described with respect to the preferred embodiments, it will be understood by those skilled in the art that various changes and modifications may be made without departing from the spirit and scope of the invention as defined in the following claims.

What is claimed is:

1. A method for double side stack packaging a plurality of chips, comprising
forming a hole through a substrate;
attaching a first chip to a bottom surface of the substrate to cover a bottom of the hole by using a thermo compression;
electrically interconnecting the first chip to terminals formed on a vertical inner sidewall of the hole using a first wire bonding;
coating a first epoxy on the bottom surface of the substrate and the first chip and installing thereon a first heat spreader and then curing the first epoxy;
attaching a second chip to a top surface of the substrate to cover a top of the hole by using a second epoxy;
electrically interconnecting the second chip to terminals formed on the top surface of the substrate using a second wire bonding; and
coating an encapsulation resin on the top surface of the substrate and the second chip and installing thereon a second heat spreader and then curing the encapsulation resin.

2. The method of claim 1, wherein the substrate is a printed circuit board.

3. The method of claim 1, wherein the first and the second heat spreader facilitate heat dissipation of the first and the second chip.

4. The method of claim 1, wherein the encapsulation resin is an epoxy molding compound (EMC).

5. A method for double side stack packaging a plurality of chips, comprising:
forming a hole through a substrate;
attaching a first chip to a bottom surface of the substrate to cover a bottom of the hole;
electrically interconnecting the first chip to terminals formed on a vertical inner sidewall of the hole;
packaging the bottom surface of the substrate and the first chip;
attaching a second chip to a top surface of the substrate to cover a top of the hole;
electrically interconnecting the second chip to terminals formed on the top surface of the substrate; and
packaging the top surface of the substrate and the second chip.

6. The method of claim 5, wherein the attachment of the first chip to the bottom surface of the substrate is performed by using a thermo compression.

7. The method of claim 5, wherein the electrical interconnection of the first and the second chip to terminals are performed by using a wire bonding.

8. The method of claim 5, wherein the packaging of the bottom surface of the substrate and the first chip and the packaging of the top surface of the substrate and the second chip further include installing a first and a second heat spreader onto the first and the second chip, respectively.

9. The method of claim 5, wherein the substrate is a printed circuit board.

10. The method of claim 8, wherein the first and the second heat spreader facilitate heat dissipation of the first and the second chip.

* * * * *